(12) United States Patent
Lee et al.

(10) Patent No.: US 10,984,212 B1
(45) Date of Patent: Apr. 20, 2021

(54) FINGERPRINT DETECTION DEVICE

(71) Applicant: SuperC-Touch Corporation, New Taipei (TW)

(72) Inventors: Hsiang-Yu Lee, New Taipei (TW); Shang Chin, New Taipei (TW); Ping-Tsun Lin, New Taipei (TW); Chia-Hsun Tu, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 20 days.

(21) Appl. No.: 16/675,849

(22) Filed: Nov. 6, 2019

(30) Foreign Application Priority Data

Sep. 27, 2019 (TW) .................................. 108134981

(51) Int. Cl.
*G06K 9/00* (2006.01)
*H05K 9/00* (2006.01)
*H01L 27/02* (2006.01)

(52) U.S. Cl.
CPC ....... *G06K 9/0002* (2013.01); *G06K 9/00053* (2013.01); *H01L 27/0248* (2013.01); *H05K 9/0067* (2013.01)

(58) Field of Classification Search
CPC ........ G06K 9/00006–0012; G06K 2009/0006; G06F 3/044–0448
See application file for complete search history.

(56) References Cited

U.S. PATENT DOCUMENTS

| | | | | |
|---|---|---|---|---|
| 10,671,829 B2* | 6/2020 | Lee | .................... | G06K 9/00053 |
| 10,713,459 B2* | 7/2020 | Gong | .................... | B06B 1/0692 |
| 10,719,681 B2* | 7/2020 | Lee | .................... | H01L 27/3234 |
| 10,777,122 B2* | 9/2020 | Kim | .................... | G09G 3/3225 |
| 10,796,125 B2* | 10/2020 | Gong | .................... | G02F 1/133512 |
| 2019/0073505 A1* | 3/2019 | Kwon | .................... | G06K 9/0004 |
| 2019/0197282 A1* | 6/2019 | Gong | .................... | G06F 3/0412 |
| 2019/0197944 A1* | 6/2019 | Kim | .................... | G09G 3/30 |
| 2019/0205594 A1* | 7/2019 | Lee | .................... | G06F 1/1684 |
| 2019/0205595 A1* | 7/2019 | Gong | .................... | G06F 1/1643 |
| 2019/0205596 A1* | 7/2019 | Kim | .................... | B06B 1/0692 |
| 2019/0205603 A1* | 7/2019 | Lee | .................... | G06K 9/0002 |
| 2019/0272407 A1* | 9/2019 | Park | .................... | H01L 27/3234 |
| 2020/0057467 A1* | 2/2020 | Kim | .................... | G06F 1/16 |
| 2020/0218873 A1* | 7/2020 | Guo | .................... | G06K 9/00013 |

(Continued)

*Primary Examiner* — Patrick F Marinelli
(74) *Attorney, Agent, or Firm* — Muncy, Geissler, Olds & Lowe, P.C.

(57) ABSTRACT

The present invention provides a fingerprint detection device, including: a substrate, a switch circuit layer, a sensing electrode layer, a heat dissipating antistatic structure layer, and a protective layer. The switch circuit layer is disposed on the substrate. The sensing electrode layer is disposed on the switch circuit layer, and includes a plurality of sensing electrodes. The heat dissipating antistatic structure layer is disposed on the sensing electrode layer, and includes a conductive mesh and a plurality of shunt heat sinks. The conductive mesh is formed with a plurality of mesh openings, and configured to shunt charges. The shunt heat sinks are adjacent to the conductive mesh, and correspond to the sensing electrodes. The shunt heat sinks are electrically insulated from each other, electrically insulated from the conductive mesh, and electrically insulated from the sensing electrodes. The protective layer is disposed on the heat dissipating antistatic structure layer.

19 Claims, 9 Drawing Sheets

(56) References Cited

U.S. PATENT DOCUMENTS

| | | | |
|---|---|---|---|
| 2020/0218920 A1* | 7/2020 | Guo | G06K 9/209 |
| 2020/0292741 A1* | 9/2020 | Rhee | G06K 9/00 |
| 2020/0319682 A1* | 10/2020 | Moon | G06F 1/1643 |
| 2020/0333649 A1* | 10/2020 | Lee | G06F 1/1626 |

* cited by examiner

FINGERPRINT DETECTION DEVICE

CROSS REFERENCE TO RELATED APPLICATION

This application claims the benefits of the Taiwan Patent Application Serial Number 108134981, filed on Sep. 27, 2019, the subject matter of which is incorporated herein by reference.

BACKGROUND OF THE INVENTION

1. Field of the Invention

The present invention relates to a fingerprint detection device, which is particularly provided with an antistatic structure, and more particularly, provided with a dissipating antistatic structure.

2. Description of Related Art

Nowadays, with the rise of electronic commerce, the development of remote payment has reached a new milestone. In order to deal with the remote payment, there is a rapidly increasing demand for biometric technologies. The fingerprint identification is considered to be the primary choice among various types of the biometric technologies, because it satisfies the requirements of efficiency, security, and non-intrusion. Especially, the capacitive fingerprint detection has outstanding properties in terms of device size, manufacturing cost, power saving, reliability, and anti-counterfeiting.

However, a capacitive fingerprint detection device typically faces with a serious problem for its low electrostatic tolerance. In order to detect the weak electrical signal induced by a finger, the protective insulation of the capacitive fingerprint detection device has to be thinner (in comparison with an optical fingerprint detection device), but a thinner protective insulation does not have enough ability to protect the capacitive fingerprint detection device away from being damaged by the electrostatic discharge.

A shunt structure has been proposed to enhance the electrostatic protection. However, the electrostatic discharge always causes an extremely high temperature at a short moment in the shunt structure. Such extremely high temperature will melt or gasify the shunt structure itself or the materials around it, or even cause an explosion, and finally leads to an unrecoverable damage in the capacitive fingerprint detection device. While, it is not a good idea to use a thicker shunt structure, because it will reduce the active sensing areas of the sensing electrodes, and thus weaken the electrical signal induced by the finger. Consequently, the electrical signal is too weak and not reliable. It shows that the known shunt structure is ineffective. It now becomes a common question in this industry about how to improve the electrostatic tolerance of the capacitance fingerprint detection device.

Therefore, it is desirable to provide a novel fingerprint detection device to obviate or mitigate the aforementioned problems.

SUMMARY OF THE INVENTION

The present invention aims to provide a fingerprint detection device, which has an antistatic structure, and further has a heat dissipating antistatic structure. It can remain high efficiency and be manufactured in low cost.

According to the present invention, the antistatic structure is designed by disposing a conductive mesh to shunt or drain the electrostatic charges. The dissipating antistatic structure is designed by further disposing shunt heat sinks in mesh openings of the conductive mesh. The shunt heat sinks are chosen with good thermal conductive property, they appear as floating islands, and they are located corresponding to the sensing electrodes.

In one aspect, the shunt heat sinks can provide dual effects of current division and heat dispassion at the moment when the electrostatic discharge suddenly happens.

In another aspect, the shunt heat sinks can provide shielding effect for the sensing electrodes, to protect the sensing electrodes away from being damaged by the direct strike of the electrostatic discharge.

In still another aspect, a coupling capacitance may be formed between the floating shunt heat sink in an upper layer and the corresponding sensing electrode in a lower layer. The coupling capacitance may be in a form of parasitic capacitance. The coupling capacitance can couple charge distribution and/or charge change from the shunt heat sink to the below sensing electrode, so as to perform fingerprint detection.

In view of this, according to one aspect of the present invention, there is provided a fingerprint detection device including a substrate, a switch circuit layer, a sensing electrode layer, a heat dissipating antistatic structure layer, and a protective layer. The switch circuit layer is disposed on the substrate, and includes a plurality of transistor switches, a plurality of data lines, and a plurality of control lines. The sensing electrode layer is disposed on the switch circuit layer, and includes a plurality of sensing electrodes. The heat dissipating antistatic structure layer is disposed on the sensing electrode layer. The heat dissipating antistatic structure layer includes a conductive mesh and a plurality of shunt heat sinks. The conductive mesh is formed with a plurality of mesh openings, and configured to shunt charges. The shunt heat sinks are adjacent to the conductive mesh, and correspond to the sensing electrodes. The shunt heat sinks are electrically insulated from each other, electrically insulated from the conductive mesh, and electrically insulated from the sensing electrodes. The protective layer is disposed on the heat dissipating antistatic structure layer.

Optionally, or preferably, the heat dissipating antistatic structure layer is divided into an upper sublayer and a lower sublayer, the conductive mesh is located in the upper sublayer, and the shunt heat sinks are located in the lower sublayer.

Optionally, or preferably, each sensing electrode corresponds to one or more shunt heat sinks, and the shunt heat sink(s) corresponding to the sensing electrode has a total area equal to or greater than 625 $\mu m^2$.

Optionally, or preferably, one or more coupling capacitances are formed between each sensing electrode and the corresponding shunt heat sink(s), and the coupling capacitance(s) couples charge distribution and/or charge change of a finger to the sensing electrode.

Optionally, or preferably, when being observed along a normal direction of the substrate, one or more shunt heat sinks are exactly located in a mesh opening, of the conductive mesh.

Optionally, or preferably, the mesh opening is defined by a regional ring of the conductive mesh, and the shunt heat sink(s) located in the mesh opening has a total area greater than a total area of the regional ring.

Optionally, or preferably, each shunt heat sink has a thermal conductivity equal to or greater than 35 $Wm^{-1}K^{-1}$.

Optionally, or preferably, each shunt heat sink has a thermal conductivity equal to or greater than 100 Wm$^{-1}$K$^{-1}$, and made of molybdenum, silver, copper, gold, aluminum, or graphite.

Optionally, or preferably, the conductive mesh is electrically connected to a ground terminal, a DC reference voltage terminal, or a metal shell, and made of molybdenum, silver, copper, gold, aluminum, or graphite.

Optionally, or preferably, the fingerprint detection device further includes an upper insulating layer disposed between the sensing electrode layer and the heat dissipating antistatic structure layer.

Optionally, or preferably, the thermal conductivity of each shunt heat sink is greater than the thermal conductivity of the upper insulating layer for five times or more.

Optionally, or preferably, the upper insulating layer includes a first point-of-evaporation material layer and/or a second point-of-evaporation material layer.

Optionally, or preferably, the first point-of-evaporation material layer is made of silicon nitride compound, and the second point-of-evaporation material layer is made of curing acrylic material.

Optionally, or preferably, the fingerprint detection device further includes a shielding electrode layer disposed between the switch circuit layer and the sensing electrode layer, and including at least one shielding electrode. The shielding electrode is configured to provide shielding effect between the switch circuit layer and the sensing electrode layer.

Optionally, or preferably, the fingerprint detection device further includes a middle insulating layer disposed between the shielding electrode layer and the sensing electrode layer.

Optionally, or preferably, the fingerprint detection device further includes a lower insulating layer disposed between the switch circuit layer and the shielding electrode layer.

Optionally, or preferably, the fingerprint detection device further includes a detecting circuit connected to the sensing electrodes of the sensing electrode layer through the switch circuit layer, and configured to select one sensing electrode, and receive a finger sensing signal from the selected sensing electrode.

Optionally, or preferably, the detecting circuit is further configured to orderly or randomly apply an alternating electrode stimulating signal to the selected sensing electrode.

Optionally, or preferably, the detecting circuit is further configured to apply an alternating finger stimulating signal to a finger of a target object.

Other objects, advantages, and novel features of the present invention will become more apparent from the following detailed description when taken in conjunction with the accompanying drawings.

BRIEF DESCRIPTION OF THE DRAWINGS

FIGS. 6A and 6B show schematic diagrams of coupling capacitances formed between the shunt heat sinks and the sensing electrodes; and.

DETAILED DESCRIPTION OF THE EMBODIMENT

Figure 1:
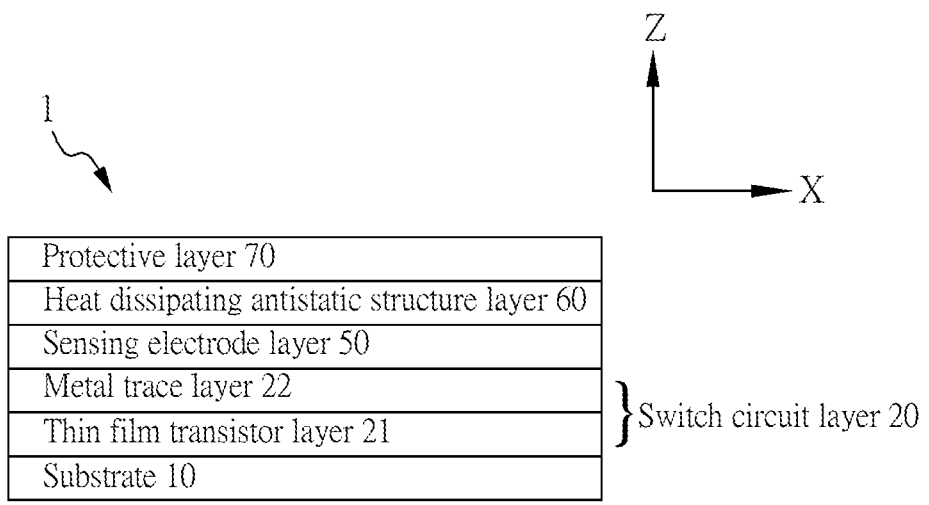
FIG. 1 shows a structural diagram of the fingerprint detection device according to one embodiment of the present invention.

Different embodiments of the present invention are provided in the following description. These embodiments are meant to explain the technical content of the present invention, but not meant to limit the scope of the present invention. A feature described in an embodiment may be applied to other embodiments by suitable modification, substitution, combination, or separation.

It should be noted that, in the present specification, when a component is described to have an element, it means that the component may have one or more of the elements, and it does not mean that the component has only one of the element, except otherwise specified.

Moreover, in the present specification, the ordinal numbers, such as "first" or "second", are used to distinguish a plurality of elements having the same name, and it does not means that there is essentially a level, a rank, an executing order, or an manufacturing order among the elements, except otherwise specified. A "first" element and a "second" element may exist together in the same component, or alternatively, they may exist in different components, respectively. The existence of an element described by a greater ordinal number does not essentially means the existent of another element described by a smaller ordinal number.

Moreover, in the present specification, the terms, such as "top", "bottom", "left", "right", "front", "back", or "middle", as well as the terms, such as "on", "above", "under", "below", or "between", are used to describe the relative positions among a plurality of elements, and the described relative positions may be interpreted to include their translation, rotation, or reflection.

Moreover, in the present specification, when an element is described to be arranged "on" another element, it does not essentially means that the elements contact the other element, except otherwise specified. Such interpretation is applied to other cases similar to the case of "on".

Moreover, in the present specification, the terms, such as "preferably" or "advantageously", are used to describe an optional or additional element or feature, and in other words, the element or the feature is not an essential element, and may be ignored.

Moreover, each component, may be realized as a single circuit or an integrated circuit in suitable ways, and may include one or more active elements, such as transistors or logic gates, or one or more passive elements, such as resistors, capacitors, or inductors, but not limited thereto. Each component may be connected to each other in suitable ways, for example, by using one or more traces to for in series connection or parallel connection, especially to satisfy the requirements of input terminal and output terminal. Furthermore, each component may allow transmitting or receiving input signals or output signals in sequence or in parallel. The aforementioned configurations may be realized depending on practical applications.

Moreover, in the present specification, the terms, such as "system", "apparatus", "device", "module", or "unit", refer to an electronic element, or a digital circuit, an analogous circuit, or other general circuit, composed of a plurality of electronic elements, and there is not essentially a level or a rank among the aforementioned terms, except otherwise specified.

Moreover, in the present specification, two elements may be electrically connected to each other directly or indirectly, except otherwise specified. In an indirect connection, one or more elements, such as resistors, capacitors, or inductors may exist between the two elements. The electrical connection is used to send one or more signals, such as DC or AC currents or voltages, depending, on practical applications.

FIG. 1 shows a structural diagram of the fingerprint detection device 1 according to one embodiment of the present invention.

As shown in FIG. 1, a basic structure of the fingerprint detection device 1 of the present invention includes a substrate 10, a switch circuit layer 20, a sensing electrode layer 50, a heat dissipating antistatic structure layer 60, and a protective layer 70. They are stacked in sequence along a normal direction Z of the substrate 10. The normal direction Z is perpendicular to a main surface of the substrate 10.

Figure 2A:
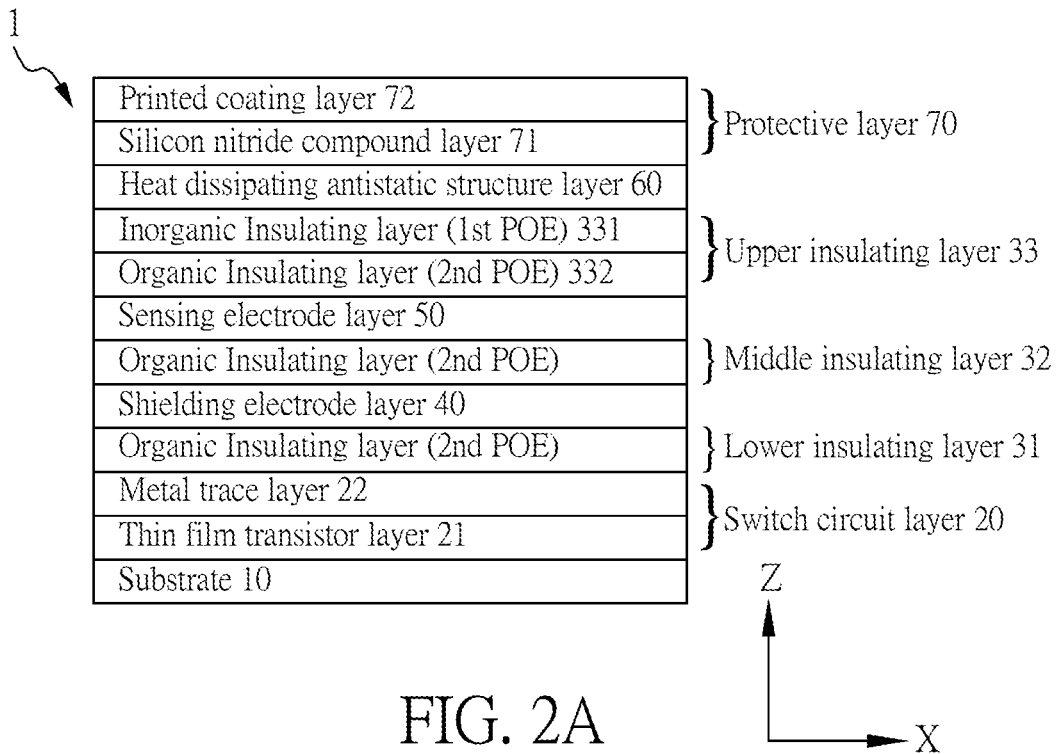
FIG. 2A shows a structural diagram of the fingerprint detection device according to another embodiment of the present invention.

FIG. 2A shows a structural diagram of the fingerprint detection device 1 according to another embodiment of the present invention.

The embodiment of FIG. 2A is derived from the embodiment of FIG. 1. In the embodiment of FIG. 2A, the fingerprint detection device 1 includes a substrate 10, a switch circuit layer 20, a shielding electrode layer 40, a sensing electrode layer 50, a heat dissipating antistatic structure layer 60, and a protective layer 70. They are stacked in sequence along a normal direction Z of the substrate 10. Two successively mentioned layers may contact each other, but there may be an additional layer disposed between them.

The switch circuit layer 20 may be divided into a thin film transistor layer 21 and a metal trace layer 22. The thin film transistor layer 21 and the metal trace layer 22 may be two different layers arranged in the normal direction Z, or alternatively, they may be integrated into the same layer. The thin film transistor layer 21 includes a plurality of transistor switches 211 (referring to FIG. 3A). The metal trace layer 22 may include a plurality of data lines and a plurality of control lines. The data lines are connected to the sensing electrodes 501, respectively through the transistor switches 211 which are controlled by the control lines.

Figure 4A:
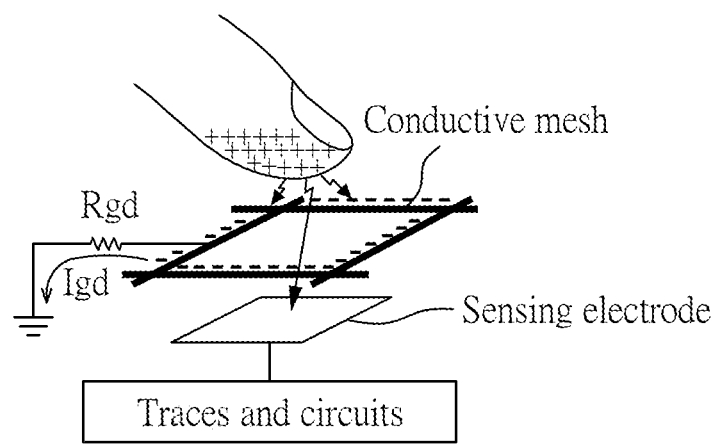
FIG. 4A shows a schematic diagram illustrating how the electrostatic discharge causes damage.
Figure 4B:
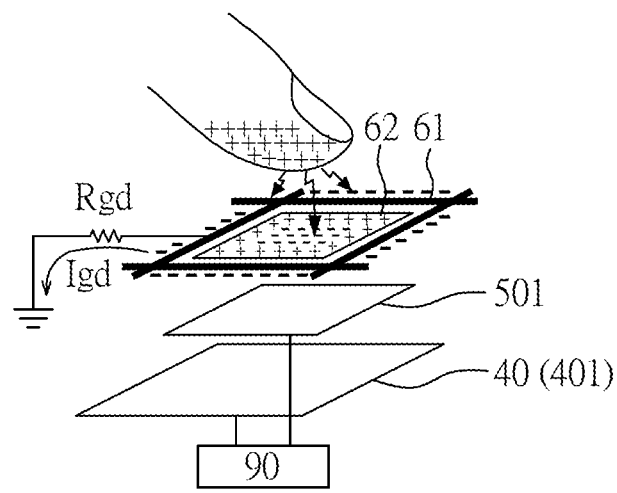
FIG. 4B shows a perspective diagram of the heat dissipating antistatic structure layer according to one embodiment of the present invention.

The shielding electrode layer 40 includes at least one shielding electrode 401 (referring to FIG. 4B). It is possible to shield the whole or a part of the sensing electrode layer 50 by one or more the shielding electrodes 401. The shielding electrode 401 is configured to provide shielding effect between the switch circuit layer 20 and the sensing electrode layer 50, to avoid interfering with and distorting the signals (especially, the finger sensing signal SR) carried in the switch circuit layer 20.

Figure 3A:
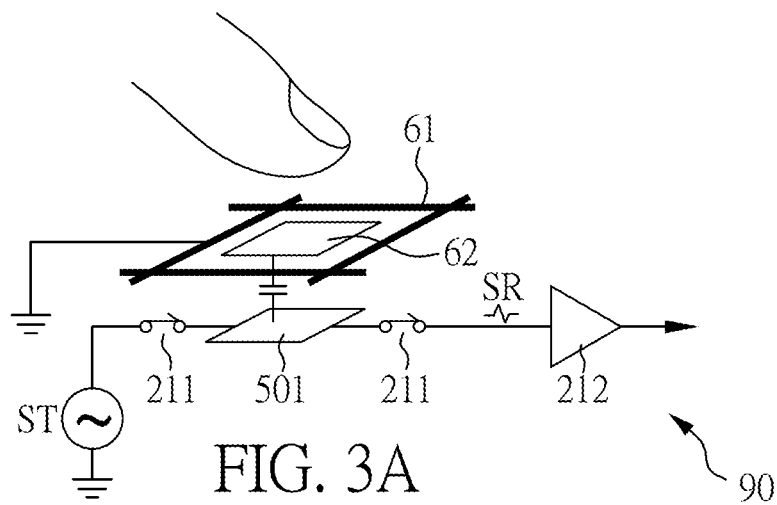
FIGS. 3A, 3B, and 3C show three types of the detecting circuits according to the present invention.

The sensing electrode layer 50 includes a plurality of sensing electrodes 501 (referring to FIG. 3A). The sensing electrode 501 is configured to sense charges carried on a finger of a target object (e.g. a human being).

Figure 3B:
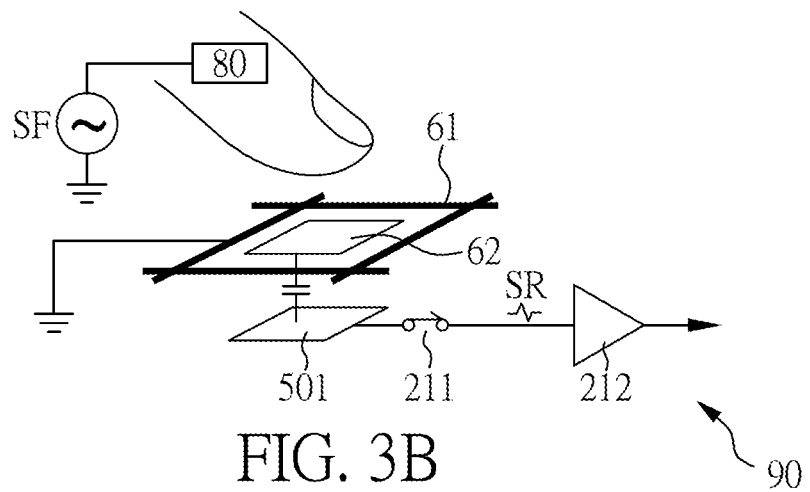
Figure 3C:
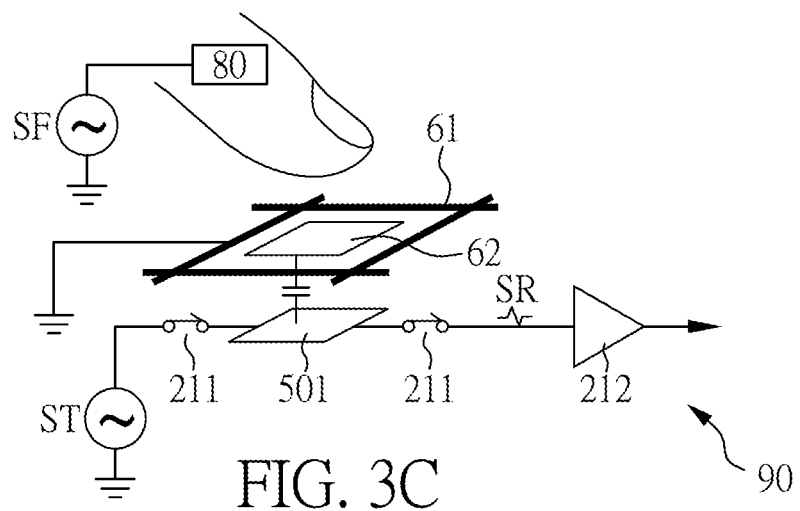

FIGS. 3A, 3B, and 3C show three types of the detecting circuits 90 according to the present invention, used for self-capacitance sensing, mutual-capacitance sensing, and self and mutual hybrid capacitance sensing, respectively.

The fingerprint detection device 1 includes a detecting circuit 90. The detecting circuit 90 may be disposed in the switch circuit layer 20, but not limited thereto. In other embodiments, the detecting circuit 90 may be an external integrated circuit that is independent from the structure of FIG. 2A, and it is an important issue about how to ensure the accuracy of the finger sensing signals, because it requires a longer signal path in this case.

As shown in FIGS. 3A, 3B, and 3C, the detecting circuit 90 is connected to the sensing electrodes 501 of the sensing electrode layer 50 thought circuits (such as transistor switch (s) 211 and/or amplifier(s) 212) in the switch circuit layer 20, and configured to select one sensing electrode 501, and receive a finger sensing signal SR from the selected sensing electrode 501.

FIG. 3A shows that in the self-capacitance sensing mechanism, the detecting circuit 90 may further be configured to orderly (e.g. sequentially) or randomly apply an electrode stimulating signal ST (which may be an alternating signal) to the selected sensing electrode 501. In particular, the electrode stimulating signal ST is transmitted to a specified (or selected) sensing electrode 501 a finger induces charge distribution or charge change in the specified sensing electrode 501, and thus generates the finger sensing signal SR, and then the detecting circuit 90 receives the finger sensing signal SR from the specified sensing electrode 501.

FIG. 3B shows that in the mutual-capacitance sensing mechanism, the detecting circuit 90 may further be configured to apply a finger stimulating signal SF (which may be an alternating signal) to a finger of a target object. In particular, the fingerprint detection device 1 may include a metal frame 80, and the finger stimulating signal SF is transmitted to the metal frame 80. When the finger approaches the fingerprint detection device 1, any part of the finger may contact the metal frame 80, to receive weak current or charges (safe to living things), so that the finger may induce a stronger finger sensing signal SR, and thus improve the accuracy of the finger detection.

The self and mutual hybrid capacitance sensing mechanism in FIG. 3C is the combination of the mechanisms of FIGS. 3A and 3B.

FIG. 4A shows a schematic diagram illustrating how the electrostatic discharge causes damage.

As shown in FIG. 4A, a finger approaching the sensing electrode may carry excessive charges, and the excessive charges may jump into the fingerprint detection device and damage its internal components. In order to drain the charges jumping into the fingerprint detection device, the conductive mesh is introduced in the fingerprint detection device. The conductive mesh is typically formed of thinner metal stripes to avoid interfering with the sensing electrodes. However, the conductive mesh formed of the thinner metal stripes has greater resistance that is difficult to drain the charges, and therefore, when facing with the electrostatic discharge, the accumulated charges cause an extremely high temperature (e.g. over ten thousand degrees centigrade) in a short moment. Such extremely high temperature will melt, or even gasify the whole conductive mesh and/or the materials around it.

FIG. 4B shows a perspective diagram of the heat dissipating antistatic structure layer 60 according to one embodiment of the present invention.

The heat dissipating antistatic structure layer 60 includes a conductive mesh 61 and a plurality of shunt heat sinks 62. The shunt heat sinks 62 are adjacent to the conductive mesh 61. In this embodiment, the conductive mesh 61 and the shunt heat sinks 62 are arranged in the same layer in the normal direction Z.

As shown in FIGS. 4A and 4B, the conductive mesh 61 is electrically connected to a ground terminal, or alternatively, the conductive mesh 61 may be electrically connected to a DC reference voltage terminal or a metal shell, so as to drain the charges. The conductive mesh 61 has a resistance Rgd. The charges drain from the conductive mesh 61 to the ground terminal as a current Igd. The conductive mesh 61 may be made of molybdenum, silver, copper, gold, aluminum, or graphite, for example.

Figure 5:
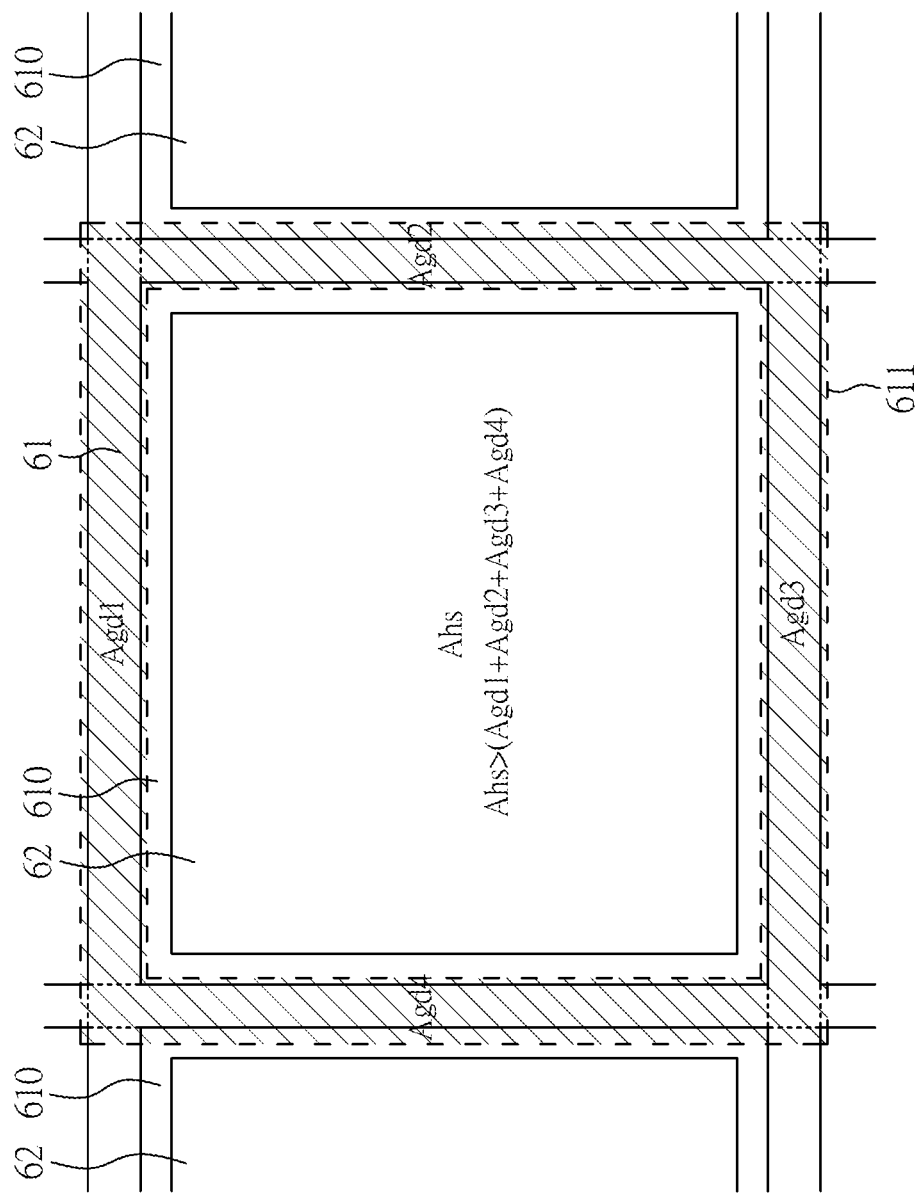
FIG. 5 shows a planar diagram of the conductive mesh and the shunt heat sink according to one embodiment of the present invention.

FIG. 5 shows a planar diagram of the conductive mesh 61 and the shunt heat sink 62 according to one embodiment of the present invention, observed along the normal direction Z of the substrate 10.

As shown in FIG. 5, the conductive mesh 61 is formed with a plurality of mesh openings 610. A mesh opening 610 is defined by a regional ring 611 of the conductive mesh 61. The regional ring 611 surrounding and defining the mesh opening 610 includes a first strip, a second strip, a third strip, and a fourth strip, having a first area Agd1, second area Agd2, a third area Agd3, and a fourth area Agd4, respectively.

Preferably, according to the present invention, the one or more shunt heat sinks 62 in a mesh opening 610 have a total area Ahs, and the total area Ahs is greater than a total area of the regional ring 611 surrounding and defining the mesh opening 610, that is, Ahs>Agd1+Agd2+Agd3+Agd4.

Figure 6A:
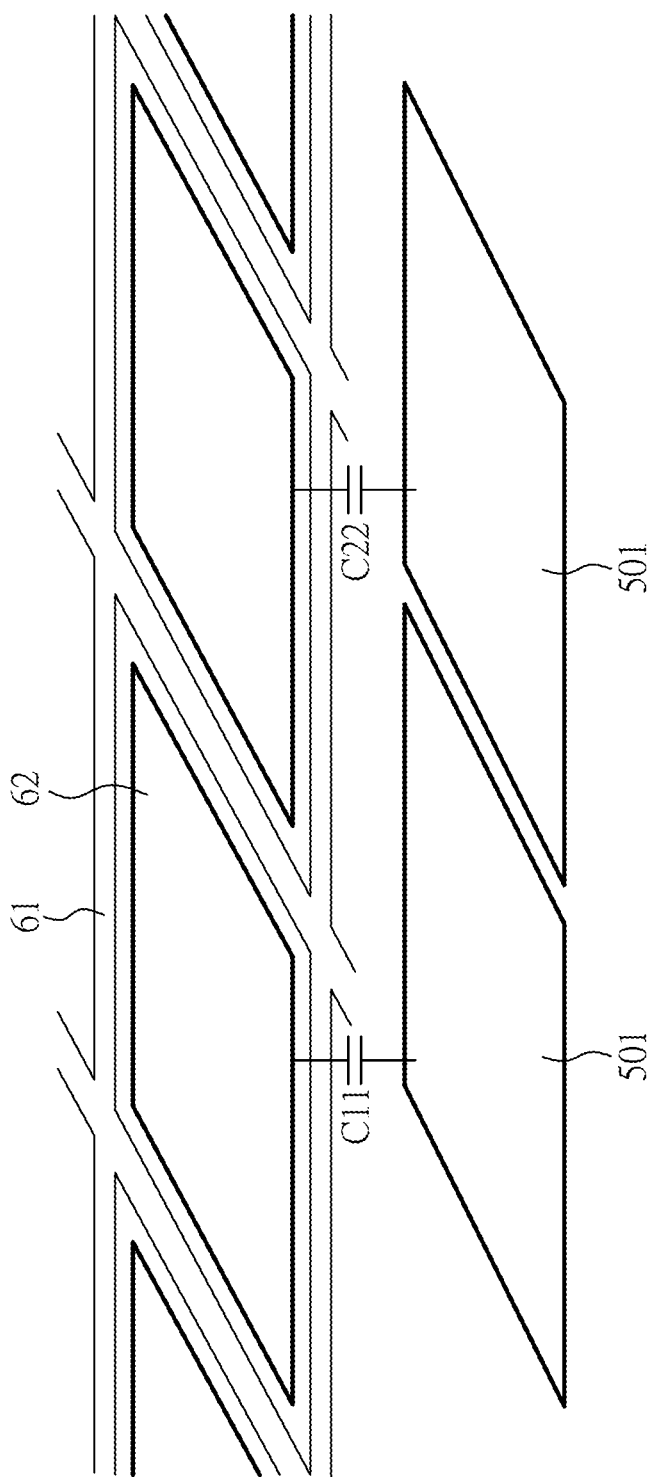
Figure 6B:
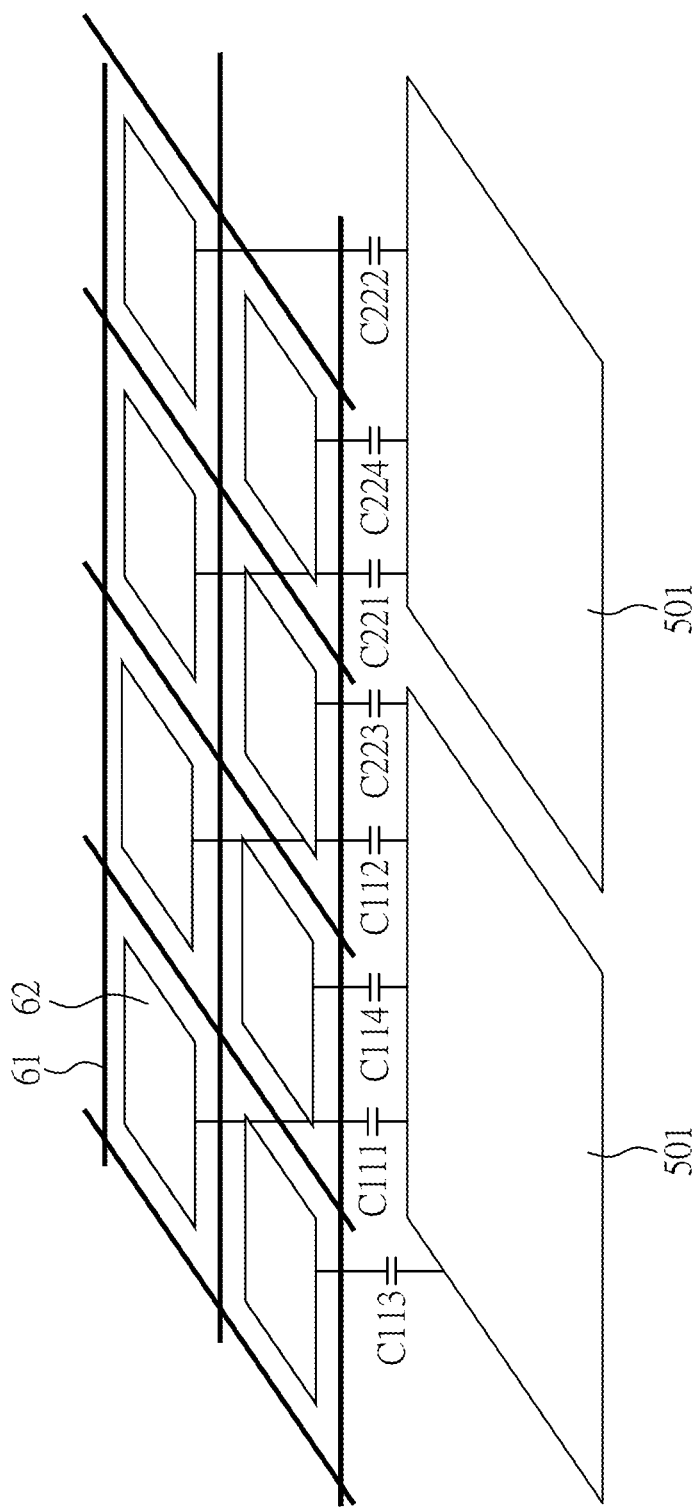

FIGS. 6A and 6B show schematic diagrams of coupling capacitances formed between the shunt heat sinks 62 and the sensing electrodes 501.

Referring to FIGS. 5, 6A, and 6B, the sensing electrodes 501 of the sensing electrode layer 50 and the mesh openings 610 of the conductive mesh 61 may be one-to-one corresponding or one-to-many corresponding, and they may be orderly aligned with each other when being observed along the normal direction Z, for example. Meanwhile, the shunt heat sinks 62 correspond to the sensing electrodes 501. One sensing electrode 501 may correspond to one or more shunt heat sinks 62. The shunt heat sink(s) 62 are located in the mesh opening(s) 610, respectively. In particular, one or more shunt heat sinks 62 may exist in one mesh opening 610.

The shunt heat sinks 62 are electrically insulated from each other, electrically insulated from the conductive mesh 61, and electrically insulated from the sensing electrodes 501. Therefore, each shunt heat sink 62 appears as a floating island.

In one aspect, the shunt heat sinks 62 can greatly improve heat dissipating effect. In order to achieve good heat dissipating effect, the shunt heat sink 62 is chosen to have a thermal conductivity equal to or greater than 35 $Wm^{-1}K^{-1}$. Preferably, the shunt heat sink 62 may have a thermal conductivity equal to or greater than 100 $Wm^{-1}K^{-1}$. The shunt heat sink 62 may be made of molybdenum, silver, copper, gold, aluminum, or graphite, for example, and thus they are electrically conductive, to facilitate the shunt or drain of the charges. The current induced in the fingerprint detection device 1 by the electrostatic discharge will dramatically increase the temperature around a certain component (such as the conductive mesh 61 or the sensing electrode layer 50), and may damage the certain component or the materials around it. For this, the aforementioned thermal conductivity of the shunt heat sink 62 is chosen to ensure heat dissipating efficiency.

It should be noted that, the floating state of the shunt heat sink 62 may be changed in different conditions. In the normal conditions, the shunt heat sink(s) 62 is in the floating state, so they do not affect the finger detection. However, when the electrostatic discharge occurs, the electrostatic discharge will cause an extremely high temperature that induces electron ionization in the fingerprint detection device 1, and the shunt heat sink(s) 62 turns to having ability to shunt or drain the charges, even if they are arranged as isolated islands. In other word, the shunt heat sink(s) may be regarded to be conductive in the extremely high temperature.

In another aspect, the shunt heat sink 62 can provide shielding effect for the sensing electrode 501, to protect the sensing electrode 501 away from being damaged by the direct strike of the electrostatic discharge.

In still another aspect, one or more coupling capacitances may be formed between each sensing electrode 501 and the corresponding shunt heat sink(s) 62, and the coupling capacitances couple charge distribution and/or charge change in the shunt heat sink 62 induced by a finger to the sensing electrode 501, so as to perform fingerprint detection.

FIG. 6A shows that each sensing electrode 501 corresponds to one shunt heat sink 62, and thus one coupling capacitance, e.g. C11, is formed between them. FIG. 6B shows that each sensing electrode 501 corresponds to a plurality of (e.g. four) shunt heat sinks 62, and thus a plurality of (e.g. four) coupling capacitance, e.g. C111, C112, C113, and C114 are formed between them.

Preferably, according to the present invention, one or more shunt heat sinks 62 corresponding to one sensing electrode 501 have a total area Ahs equal to or greater than 625 $\mu m^2$.

Referring back to FIG. 2A, the protective layer 70 is used to protect other layers away from physical impact or chemical corrosion. In this embodiment, the protective layer 70 may further be divided into a silicon nitride compound layer 71 and a printing coating layer 72.

Preferably, a lower insulating layer 31 may be disposed between the switch circuit layer 20 and the shielding electrode layer 40. Preferably, a middle insulating layer 32 may be disposed between the shielding electrode layer 40 and the sensing electrode layer 50. The lower insulating layer 31 or the middle insulating layer 32 may be a second point-of-evaporation (POE) material layer, and made of curing acrylic material, for example.

Preferably, an upper insulating layer 33 may be disposed between the sensing electrode layer 50 and the heat dissipating antistatic structure layer 60. In this embodiment, the upper insulating layer 33 may further include a first point-of-evaporation material layer 331 and/or a second point-of-evaporation material layer 332, wherein the first point-of-evaporation material layer 331 may be made of silicon nitride compound, for example, and the second point-of-evaporation material layer 332 may be made of curing acrylic material, for example. The shunt heat sink 62 is chosen to have a thermal conductivity greater than the thermal conductivity the upper insulating layer 33 for at least five times.

Figure 2B:
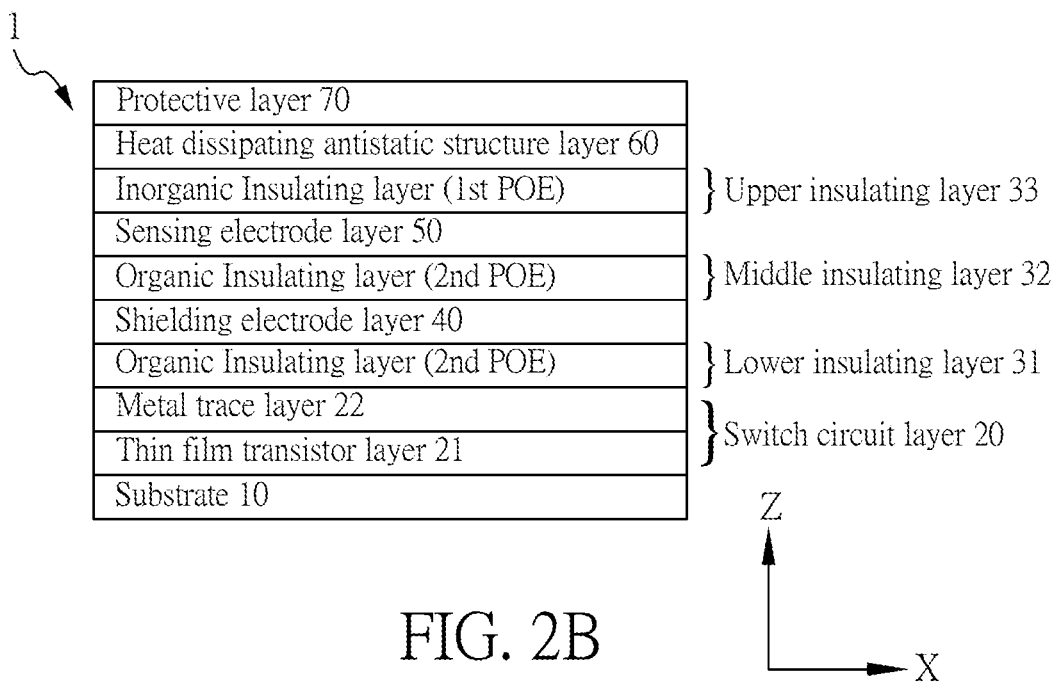
FIG. 2B shows a structural diagram of the fingerprint detection device according to still another embodiment of the present invention.

FIG. 2B shows a structural diagram of the fingerprint detection device 1 according to still another embodiment of the present invention.

The embodiment of FIG. 2B is derived from the embodiments of FIGS. 1 and 2A. The embodiment of FIG. 2B is different from the embodiment of FIG. 2A in that: the upper insulating layer 33 only includes a first point-of-evaporation material layer, made of silicon nitride compound, for example.

Figure 2C:
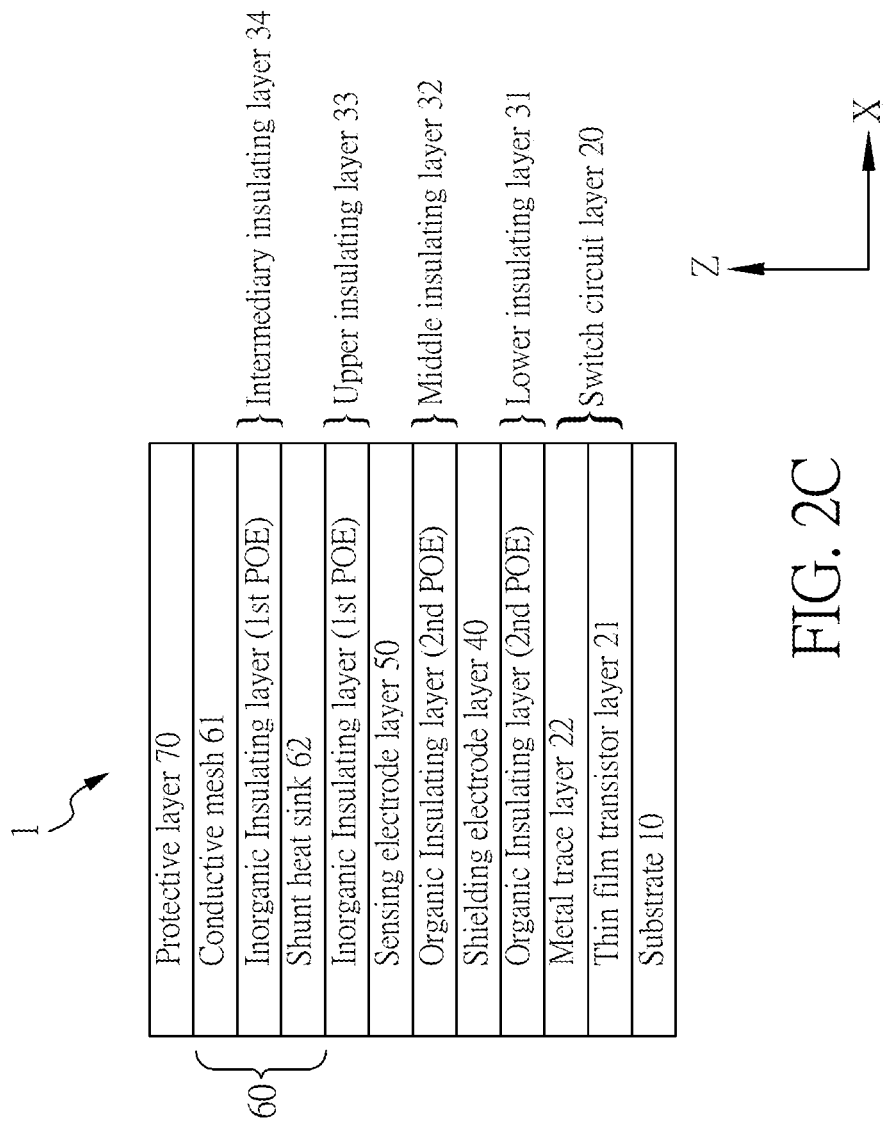
FIG. 2C shows a structural diagram of the fingerprint detection device according to yet still another embodiment of the present invention.

FIG. 2C shows a structural diagram of the fingerprint detection device 1 according to yet still another embodiment of the present invention.

The embodiment of FIG. 2C is derived from the embodiments of FIGS. 1 and 2B. The embodiment of FIG. 2C is different from the embodiment of FIG. 2B in that: the heat dissipating antistatic structure layer 60 is divided into an upper sublayer and a lower sublayer, the conductive mesh 61 is located in the upper sublayer, and the shunt heat sinks 62 is located in the lower sublayer. However, when being observed along the normal direction Z of the substrate 10, one or more shunt heat sinks 62 are still located in a mesh opening 610, and thus their have the same appearance as shown in FIG. 5.

In addition, an intermediary insulating layer 34 may be disposed between the upper sublayer (i.e. wherein the conductive mesh 61 is located) and the lower sublayer (i.e. wherein the shunt heat sinks 62 are located). The intermediary insulating layer 34 includes a first point-of-evaporation material layer, made of silicon nitride compound, for example.

Figure 7:
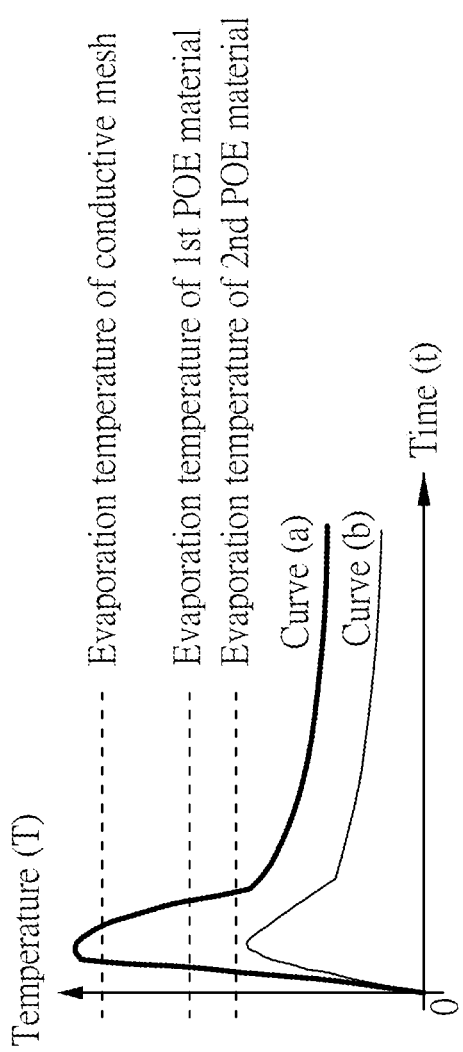
FIG. 7 shows a time-temperature diagram of the electrostatic discharge.

FIG. 7 shows a time-temperature diagram of the electrostatic discharge.

In the observation of the structures of FIGS. 2A, 2B, and 2C, the first point-of-evaporation material layer is preferably disposed close to (e.g. directly contact) the heat dissipating antistatic structure layer 60 (e.g. below it or between the sublayers composing it); while, the second point-of-evaporation material layer may be disposed in other places. Referring to FIGS. 4A, 4B, and 7, the evaporation temperature of the conductive mesh 62 is greater than the evaporation temperature of the first point-of-evaporation material layer, and the evaporation temperature of the first point-of-evaporation material layer is greater than the evaporation temperature of the second point-of-evaporation material layer.

The curve (a) is the temperature function measured around the conductive mesh (i.e. the electrostatic discharging point) in the structure of FIG. 4A (without the shunt heat sink(s) 62 of the present invention) at the moment when encountering an impact of the electrostatic discharge. At the moment, the temperature of the conductive mesh dramatically increases beyond the evaporation temperature of the first point-of-evaporation material and the evaporation temperature of the second point-of-evaporation material, even beyond the evaporation temperature of the conductive mesh. In this case, the electrostatic discharge causes an unrecoverable damage around the electrostatic discharging point.

The curve (b) is the temperature function measured around the conductive mesh 61 (i.e. the electrostatic discharging point) in the structure of FIG. 4B (with the shunt heat sink(s) 62 of the present invention) at the moment when encountering an impact of the electrostatic discharge. In this case, thanks to the good effects of current shunt and heat dissipation provided by the shunt heat sink(s) 62, the increasing temperature remains below the evaporation temperature of the second point-of-evaporation material layer, and therefore, the impact of the electrostatic discharge does not cause damage.

Although the present invention has been explained in relation to its preferred embodiment, it is to be understood that many other possible modifications and variations can be made without departing from the spirit and scope of the present invention as hereinafter claimed.

What is claimed is:

1. A fingerprint detection device, comprising:
   a substrate;
   a switch circuit layer disposed on the substrate, and including a plurality of transistor switches, a plurality of data lines, and a plurality of control lines;
   a sensing electrode layer disposed on the switch circuit layer, and including a plurality of sensing electrodes;
   a heat dissipating antistatic structure layer disposed on the sensing electrode layer, the heat dissipating antistatic structure layer including:
      a conductive mesh formed with a plurality of mesh openings, and configured to shunt charges; and
      a plurality of shunt heat sinks adjacent to the conductive mesh, and corresponding to the sensing electrodes, the shunt heat sinks being electrically insulated from each other, electrically insulated from the conductive mesh, and electrically insulated from the sensing electrodes; and
   a protective layer disposed on the heat dissipating antistatic structure layer.

2. The fingerprint detection device of claim 1, wherein the heat dissipating antistatic structure layer is divided into an upper sublayer and a lower sublayer, the conductive mesh is located in the upper sublayer, and the shunt heat sinks are located in the lower sublayer.

3. The fingerprint detection device of claim 1, wherein each sensing electrode corresponds to one or more shunt heat sinks, and the shunt heat sink(s) corresponding to the sensing electrode have a total area equal to or greater than 625 µm².

4. The fingerprint detection device of claim 1, wherein one or more coupling capacitances are formed between each sensing electrode and the corresponding shunt heat sink(s), and the coupling capacitance(s) couples charge distribution and/or charge change of a finger to the sensing electrode.

5. The fingerprint detection device of claim 1, wherein when being observed along a normal direction of the substrate, one or more shunt heat sinks are exactly located in a mesh opening of the conductive mesh.

6. The fingerprint detection device of claim 5, wherein each mesh opening is defined by a regional ring of the conductive mesh, and the shunt heat sink(s) located in the mesh opening has a total area greater than a total area of the regional ring.

7. The fingerprint detection device of claim 1, wherein each shunt heat sink has a thermal conductivity equal to or greater than 35 $Wm^{-1}K^{-1}$.

8. The fingerprint detection device of claim 1, wherein each shunt heat sink has a thermal conductivity equal to or greater than 100 $Wm^{-1}K^{-1}$, and made of molybdenum, silver, copper, gold, aluminum, or graphite.

9. The fingerprint detection device of claim 1, wherein the conductive mesh is electrically connected to a ground terminal, a DC reference voltage terminal, or a metal shell, and made of molybdenum, silver, copper, gold, aluminum, or graphite.

10. The fingerprint detection device of claim 1, further comprising an upper insulating layer disposed between the sensing electrode layer and the heat dissipating antistatic structure layer.

11. The fingerprint detection device of claim 10, wherein a thermal conductivity of each shunt heat sink is greater than a thermal conductivity of the upper insulating layer for five times or more.

12. The fingerprint detection device of claim 11, wherein the upper insulating layer includes a first point-of-evaporation material layer and/or a second point-of-evaporation material layer.

13. The fingerprint detection device of claim 12, wherein the first point-of-evaporation material layer is made of silicon nitride compound, and the second point-of-evaporation material layer is made of curing acrylic material.

14. The fingerprint detection device of claim 1, further comprising a shielding electrode layer disposed between the switch circuit layer and the sensing electrode layer, and including at least one shielding electrode, the shielding electrode being, configured to provide shielding effect between the switch circuit layer and the sensing electrode layer.

15. The fingerprint detection device of claim 14, further comprising a middle insulating layer disposed between the shielding electrode layer and the sensing electrode layer.

16. The fingerprint detection device of claim 14, further comprising a lower insulating layer disposed between the switch circuit layer and the shielding electrode layer.

17. The fingerprint detection device of claim 1, further comprising a detecting circuit connected to the sensing electrodes of the sensing electrode layer through the switch circuit layer, and configured to select one sensing electrode, and receive a finger sensing signal from the selected sensing electrode.

18. The fingerprint detection device of claim 17, wherein the detecting circuit is further configured to orderly or randomly apply an electrode stimulating signal, which is an alternating signal, to the selected sensing electrode.

19. The fingerprint detection device of claim 17, wherein the detecting circuit is further configured to apply a finger stimulating signal, which is an alternating signal, to a finger of a target object.

* * * * *